(12) United States Patent
Yang et al.

(10) Patent No.: US 11,277,930 B2
(45) Date of Patent: Mar. 15, 2022

(54) METHOD OF MANUFACTURING DISPLAY SUBSTRATE AND DISPLAY SUBSTRATE MOTHERBOARD

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Zhongying Yang, Beijing (CN); Jianpeng Wu, Beijing (CN)

(73) Assignees: BOE TECHNOLOGY GROUP CO., LTD., Beijing (CN); CHENGDU BOE OPTOELECTRONICS TECHNOLOGY CO., TLD., Sichuan (CN)

(*) Notice: Subject to any disclaimer, the term of this patent is extended or adjusted under 35 U.S.C. 154(b) by 690 days.

(21) Appl. No.: 16/090,967

(22) PCT Filed: Mar. 23, 2018

(86) PCT No.: PCT/CN2018/080157
§ 371 (c)(1),
(2) Date: Oct. 3, 2018

(87) PCT Pub. No.: WO2018/214633
PCT Pub. Date: Nov. 29, 2018

(65) Prior Publication Data
US 2021/0185844 A1    Jun. 17, 2021

(30) Foreign Application Priority Data

May 25, 2017 (CN) .......................... 201710377934.0

(51) Int. Cl.
*H05K 9/00* (2006.01)
*H05K 7/14* (2006.01)
(Continued)

(52) U.S. Cl.
CPC .......... *H05K 7/1429* (2013.01); *G06F 1/184* (2013.01); *H05K 1/181* (2013.01);
(Continued)

(58) Field of Classification Search
CPC combination set(s) only.
See application file for complete search history.

(56) References Cited

U.S. PATENT DOCUMENTS 6,927,833 B2* 8/2005 Kim .................... G02F 1/13394
349/155
8,125,593 B2* 2/2012 Matsumoto ............ G02B 5/223
349/106
(Continued)

FOREIGN PATENT DOCUMENTS

CN    101675178 A    3/2010
CN    104020534 A    9/2014
(Continued)

OTHER PUBLICATIONS

The First Chinese Office Action dated May 4, 2018; Appln. No. 201710377934.0.
(Continued)

*Primary Examiner* — Hung S. Bui

(57) ABSTRACT

A method of manufacturing a display substrate and a display substrate motherboard. The method of manufacturing the display substrate includes: providing a base substrate including a first main surface and a second main surface opposite to each other and divided into at least one active region and a dummy region located around the active region; forming a magnetic layer on at least one of the first main surface within the dummy region and the second main surface; and forming an element layer on the first main surface.

11 Claims, 4 Drawing Sheets

(51) Int. Cl.
*G06F 1/18* (2006.01)
*H05K 1/18* (2006.01)
*H01L 27/32* (2006.01)
*H01L 51/56* (2006.01)

(52) U.S. Cl.
CPC .......... *H01L 27/3283* (2013.01); *H01L 51/56* (2013.01); *H05K 2201/10128* (2013.01); *H05K 2201/10204* (2013.01)

(56) References Cited

U.S. PATENT DOCUMENTS

| | | | |
|---|---|---|---|
| 2003/0112405 A1* | 6/2003 | Kim | G02F 1/1339 349/156 |
| 2004/0135953 A1* | 7/2004 | Lee | G02F 1/1339 349/141 |
| 2009/0291610 A1 | 11/2009 | Sasaki | |
| 2015/0346544 A1 | 12/2015 | Wu et al. | |
| 2016/0233455 A1* | 8/2016 | Riedel | H01L 22/20 |
| 2017/0213975 A1 | 7/2017 | Cheng et al. | |
| 2019/0036025 A1* | 1/2019 | Nishida | H01L 51/5056 |

FOREIGN PATENT DOCUMENTS

| | | |
|---|---|---|
| CN | 203807547 U | 9/2014 |
| CN | 105679799 A | 6/2016 |
| CN | 206089790 U | 4/2017 |
| CN | 107170910 A | 9/2017 |
| JP | 2003-173872 A | 6/2003 |
| JP | 2010-271445 A | 12/2010 |
| JP | 2014-201819 A | 10/2014 |
| WO | 2016/063810 A1 | 4/2016 |

OTHER PUBLICATIONS

The International Search Report and Written Opinion dated Jul. 9, 2018; PCT/CN2018/080157.

* cited by examiner

METHOD OF MANUFACTURING DISPLAY SUBSTRATE AND DISPLAY SUBSTRATE MOTHERBOARD

The application claims priority of the Chinese patent application No. 201710377934.0, filed on May 25, 2017, the entire disclosure of which is incorporated herein by reference as part of the present application.

TECHNICAL FIELD

At least one embodiment of the disclosure relates to a method of manufacturing a display substrate and a display substrate motherboard.

BACKGROUND

Currently, users have increasing demands on display products, and the size of the display screen is also increasing correspondingly. However, the large-sized display substrate may have a drooping problem during an evaporation process adopted in the process of manufacturing the display substrate of the display screen, thereby affecting the precision of the evaporation process and affecting the display yield of the product.

SUMMARY

At least one embodiment of the disclosure provides a method of manufacturing a display substrate, comprising: providing a base substrate having a first main surface and a second main surface opposite to each other and including at least one active region and a dummy region located around the active region; forming a magnetic layer on at least one of the first main surface within the dummy region and the second main surface; and forming an element layer on the first main surface.

For example, in the method provided by at least one embodiment of the disclosure, forming the element layer on the first main surface comprises: placing the base substrate formed with the magnetic layer thereon into an evaporation device including an evaporation source and a magnetic absorption layer; and performing an evaporation process on the first main surface to form the element layer; wherein the base substrate is located between the magnetic adsorption layer and the evaporation source, and the magnetic adsorption layer is located on a side of the second main surface of the base substrate.

For example, in the method provided by at least one embodiment of the disclosure, the magnetic layer is formed on the first main surface within the dummy region, and an orthographic projection of the magnetic layer on the first main surface is located within or coincides with the dummy region.

For example, in the method provided by at least one embodiment of the disclosure, the magnetic layer is formed on the second main surface, and an orthographic projection of the magnetic layer on the second main surface is located within or coincides with the second main surface.

For example, in the method provided by at least one embodiment of the disclosure, an orthographic projection of the magnetic layer on the second main surface is located within or coincides with the dummy region.

For example, the method provided by at least one embodiment of the disclosure further comprises: processing the magnetic layer on the second main surface of the substrate with a corrosive liquid to remove the magnetic layer.

For example, the method provided by at least one embodiment of the disclosure further comprises: mounting a mask on a side of the first main surface of the substrate before the evaporation process.

For example, in the method provided by at least one embodiment of the disclosure, the element layer comprises at least one selected from the group consisting of an anode, a cathode and an organic layer between the anode and the cathode of a light emitting device.

For example, in the method provided by at least one embodiment of the disclosure, the element layer is at least formed in the active region.

For example, in the method provided by at least one embodiment of the disclosure, the at least one active region comprises a plurality of active regions arranged at intervals, and the dummy region is disposed between adjacent active regions.

For example, the method provided by at least one embodiment of the disclosure further comprises: cutting off the dummy region of the substrate.

At least one embodiment of the disclosure provides a display substrate motherboard, comprising: a base substrate having a first main surface and a second main surface opposite to each other and including at least one active region and a dummy region located around the active region; a magnetic layer on at least one of the first main surface within the dummy region and the second main surface; and an element layer on the first main surface.

For example, in the display substrate motherboard provided by at least one embodiment of the disclosure, the element layer is at least formed in the active region.

For example, in the display substrate motherboard provided by at least one embodiment of the disclosure, the magnetic layer is on the second main surface within the dummy region.

In the method of manufacturing the display substrate provided by at least one embodiment of the disclosure, the magnetic layer is formed on the main surface of the base substrate of the display substrate. During the evaporation process, drooping of the base substrate can be alleviated or eliminated by the magnetic adsorption force, so as to improve the evaporation yield of the display substrate.

BRIEF DESCRIPTION OF THE DRAWINGS

In order to clearly illustrate the technical solution of the embodiments of the disclosure, the drawings of the embodiments will be briefly described in the following. It is obvious that the described drawings are only related to some embodiments of the disclosure and thus are not limitative of the disclosure.

Figure 1A:
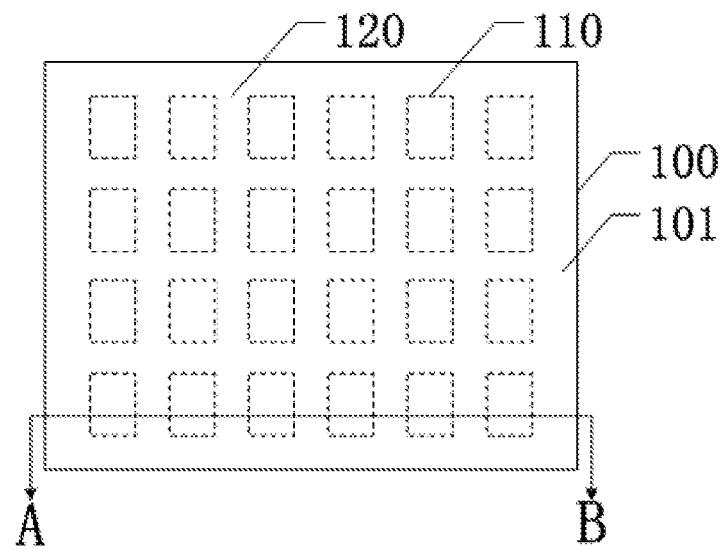
FIG. 1A is a schematic structural view of a base substrate to be processed provided by an embodiment of the disclosure.

Reference signs: 1—vacuum evaporation chamber; 2—support part; 100—base substrate; 101—first main surface; 102—second main surface; 110—active region; 120—dummy region; 200—magnetic layer; 300—magnetic adsorption layer; 400—evaporation source; 500—mask; 600—element layer; 700—display substrate sub-board.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the disclosure, are not intended to indicate any sequence, amount or importance, but to distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to limited as a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

At least one embodiment of the disclosure provides a method of manufacturing a display substrate and a display substrate motherboard. In the method of manufacturing the display substrate, by forming a magnetic layer on the base substrate, it is possible to alleviate or eliminate the drooping problem of the display substrate motherboard (a plurality of display substrate sub-boards can be obtained by cutting the display substrate motherboard) by a magnetic adsorption force.

A method of manufacturing a display substrate and a display substrate motherboard according to at least one embodiment of the disclosure will be described in detail below with reference to the accompanying drawings.

At least one embodiment of the disclosure provides a method of manufacturing a display substrate, the method comprising: providing a base substrate comprising a first main surface and a second main surface opposite to each other and divided into at least one active region and a dummy region located around the active region; forming a magnetic layer on at least one of the first main surface within the dummy region and the second main surface; and forming an element layer on the first main surface. The specific structure and function of the base substrate, the magnetic layer, and the element layer in the manufacturing method can be referred to the following description, and the embodiments are not described in detail herein.

Figure 1B:
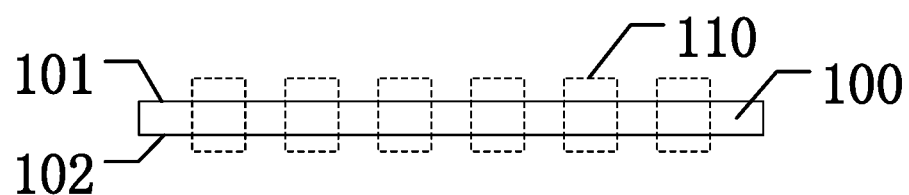
FIG. 1B is a cross-sectional view of the substrate illustrated in FIG. 1A along A-B.

For example, the method of manufacturing the display substrate provided by at least one embodiment of the disclosure comprises: providing a base substrate. FIG. 1A is a schematic structural view of a base substrate to be processed provided by an embodiment of the disclosure; and FIG. 1B is a cross-sectional view of the substrate illustrated in FIG. 1A along A-B. For example, as illustrated in FIGS. 1A and 1B, the base substrate 100 comprises a first main surface 101 and a second main surface 102 opposite to each other, and the base substrate 100 is divided into active regions 110 (the portions defined by the broken line blocks in the substrate 100 illustrated in FIGS. 1A and 1B) and a dummy region 120 (a portion outside the active regions 100 of the substrate 100) located around the active regions 100. It should be noted that, the active regions 110 and the dummy region 120 are designed for the base substrate 100, and the broken line blocks for defining the active regions 110 in FIG. 1A and FIG. 1B do not actually exist, and the specific division of the designed regions can be determined by the actual process requirements, and will not be described in the embodiments of the disclosure.

In at least one embodiment of the disclosure, the material for manufacturing the base substrate 100 is not limited. For example, the base substrate 100 can be a transparent substrate, and for example, the material for manufacturing the transparent substrate can comprise glass or transparent resin etc.

For example, in the manufacturing method provided by at least one embodiment of the disclosure, as illustrated in FIGS. 1A and 1B, the base substrate 100 can comprise a plurality of active regions 110 arranged at intervals, and the dummy region 120 is disposed between adjacent active regions 110. Thus, a display substrate motherboard can be obtained by processing the bae substrate 100, and the portions of the display substrate motherboard located in the active regions 110 can correspond to the display substrates of the display panel. In at least one embodiment of the disclosure, the specific distribution positions of the active regions 110 and the dummy region 120 on the base substrate 100 will not be limited, and can be determined according to actual process requirements. The process of processing the base substrate 100 to form the display substrate motherboard can be referenced to the relevant contents in the following embodiments (for example, the embodiment illustrated in FIGS. 5A and 5B).

For example, the method of manufacturing the display substrate provided by at least one embodiment of the disclosure further comprises forming a magnetic layer on at least one of the first main surface 101 within the dummy region 120 and the second main surface 102 of the substrate 100. The magnetic layer can be formed on the base substrate 100 at different positions, which will be described below.

Figure 2A:
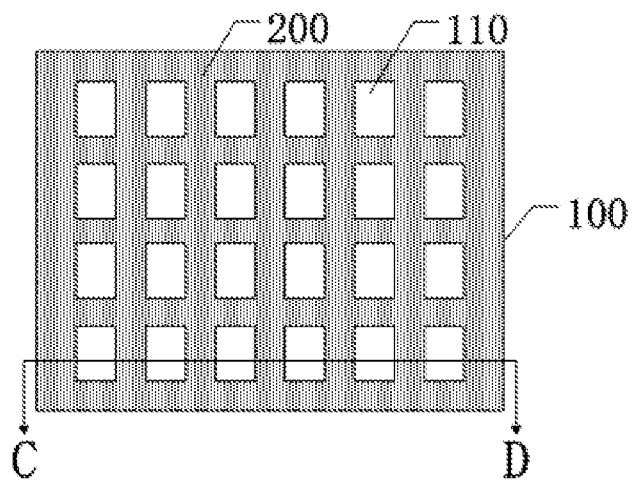
FIG. 2A is a schematic view illustrating a distribution of a magnetic layer on a first main surface of a base substrate provided by an embodiment of the disclosure.
Figure 2B:
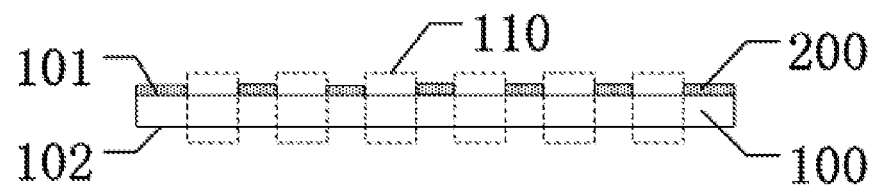
FIG. 2B is a cross-sectional view of the base substrate on which the magnetic layer is formed in FIG. 2A along C-D.

For example, in at least one embodiment of the disclosure, the magnetic layer is formed on the first main surface 101 within the dummy region 120 of the base substrate 100. FIG. 2A is a schematic view illustrating a distribution of the magnetic layer provided on the first main surface of the base substrate provided by an embodiment of the disclosure, and FIG. 2B is a cross-sectional view of the base substrate on which the magnetic layer is formed as illustrated in FIG. 2A along the C-D. For example, as illustrated in FIGS. 2A and 2B, when the magnetic layer 200 is formed on the first main surface 101 of the base substrate 100, the magnetic layer 200 is formed on the dummy region 120, that is, the magnetic layer 200 is formed only on the region corresponding to the dummy region 120 of the base substrate 100. In such a way, the arrangement of the magnetic layer 200 will not affect the subsequent processing of the display substrate, and during the cutting process, the magnetic layer 200 located on the dummy region 120 will be cut together, so the magnetic layer 200 has no effect on the finally formed product (display substrate).

It should be noted that, in at least one embodiment of the disclosure, in the case that the magnetic layer is located on the first main surface, the specific distribution of the magnetic layer on the first main surface is not limited. For example, in at least one embodiment of the disclosure, when the magnetic layer is located on the first main surface of the dummy region, an orthographic projection of the magnetic layer on the first main surface is located within the dummy region, that is, the magnetic layer covers a portion of the dummy region. Alternatively, the orthographic projection of the magnetic layer on the first main surface coincides with the dummy region, that is, the magnetic layer covers the entire dummy region, so that the area of the magnetic layer can be increased, to increase the magnetic adsorption force.

Figure 2C:
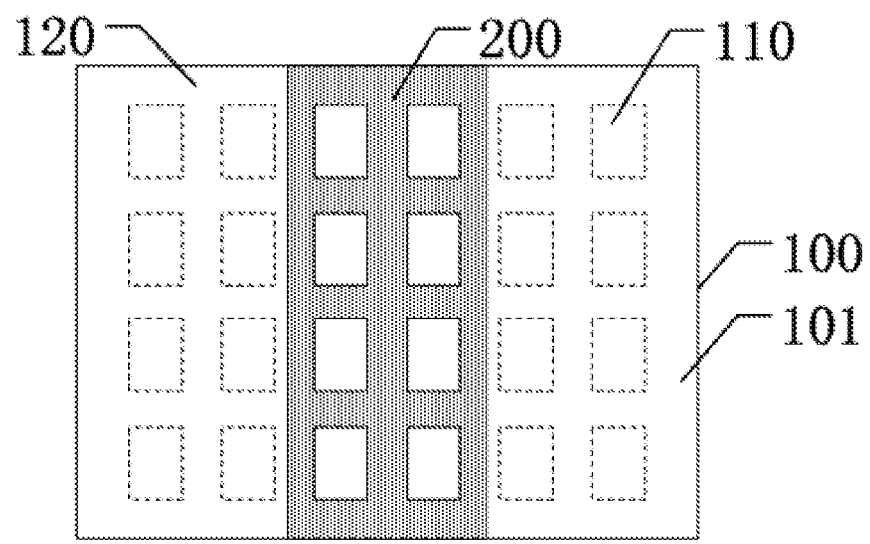
FIG. 2C is a schematic view illustrating another distribution of a magnetic layer on a first main surface of a base substrate provided by an embodiment of the disclosure.

For example, as illustrated in FIG. 2A, the magnetic layer 200 can cover the entire area of the first main surface 101 within the dummy region 120, and can also cover a partial region of the first main surface 101 within the dummy region 120. FIG. 2C is a schematic view illustrating another distribution of a magnetic layer on a first main surface of a base substrate provided by an embodiment of the disclosure. For example, as illustrated in FIG. 2C, the magnetic layer 200 is formed on a partial region of the first main surface 101 within the dummy region 120, for example, on the intermediate region of the first main surface 101 within the dummy region 120. The position at which the magnetic layer 200 is formed in the embodiment of the disclosure is not limited, provided that the magnetic layer 200 can prevent the base substrate 100 from drooping.

For example, in at least one embodiment of the disclosure, the magnetic layer can be formed on the second main surface of the base substrate. For example, the orthographic projection of the magnetic layer on the second main surface is located within the second main surface, i.e. the magnetic layer covers a portion of the second main surface; alternatively, the orthographic projection of the magnetic layer on the second main surface coincides with the second main surface, that is, the magnetic layer covers the entire second main surface, so that the area of the magnetic layer can be increased to increase the magnetic adsorption force.

For example, in at least one embodiment of the disclosure, the magnetic layer can be formed on the second main surface within the dummy region of the base substrate. In such a way, in the subsequent process of cutting the dummy region, the magnetic layer can be simultaneously removed, simplifying the manufacturing process. For example, the orthographic projection of the magnetic layer on the second main surface is located within the dummy region; alternatively, the orthographic projection of the magnetic layer on the second main surface coincides with the dummy region, thereby increasing the area of the magnetic layer to increase the magnetic adsorption force.

Figure 3A:
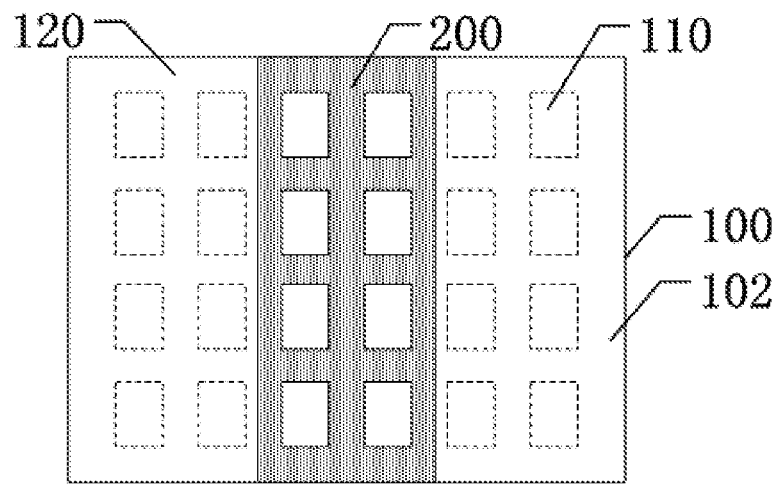
FIG. 3A is a schematic view illustrating a distribution of a magnetic layer on a second main surface of a base substrate provided by an embodiment of the disclosure.

FIG. 3A is a schematic view illustrating a distribution of a magnetic layer on a second main surface of a base substrate provided by an embodiment of the disclosure. For example, as illustrated in FIG. 3A, the magnetic layer 200 is formed on the second main surface 102 and in the dummy region 120, that is, on the second main surface 102 within the dummy region 120 of the base substrate 100. The magnetic layer 200 can cover the entire second main surface 102 or a portion of the second main surface 102 within the dummy region 120. For the embodiment as illustrated in FIG. 3A, the method by which the magnetic layer 200 is formed can refer to the related description in the above mentioned embodiments (the embodiments in which the magnetic layer 200 is formed on the first main surface 101 of the base substrate 100), which will not be described in the embodiments of the disclosure herein.

Figure 3B:
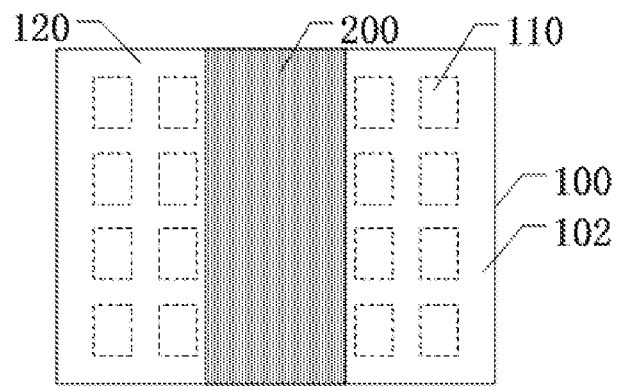
FIG. 3B is a schematic view of another distribution of a magnetic layer on a second main surface of a base substrate provided by an embodiment of the disclosure.

It should be noted that, in the case that the magnetic layer is formed on the second main surface of the base substrate, the specific position of the magnetic layer is not limited in the embodiment of the disclosure. FIG. 3B is a schematic view illustrating another distribution of a magnetic layer on a second main surface of a base substrate provided by an embodiment of the disclosure. For example, as illustrated in FIG. 3B, when the magnetic layer 200 is disposed on the second main surface 102 of the base substrate 100, the magnetic layer 200 can also cover the second main surface 102 within the active region 110 of the base substrate 100, and the magnetic layer 200 can cover the entire second main surface 102 or a portion of the second main surface 102 of the base substrate 100, which is not limited by the embodiments of the disclosure.

For example, in at least one embodiment of the disclosure, the material of manufacturing the magnetic layer 200 can comprise a metal material having magnetic conductivity or a magnetic metal material, and the metal material can comprise, for example, a metal such as iron, cobalt, or nickel or the alloy thereof; the material for manufacturing the magnetic layer 200 can also comprise other magnetic materials. In at least one embodiment of the disclosure, the specific material for manufacturing the magnetic layer 200 is not limited, provided that the magnetic layer 200 has the magnetic conductivity.

For example, in at least one embodiment of the disclosure, the method by which the magnetic layer 200 is formed is not limited. The arrangement position of the magnetic layer 200 illustrated in FIG. 2A is illustrated as an example. The method of forming the magnetic layer 200 on the base substrate 100 can comprise: forming a magnetic material layer on the first main surface 101 of the base substrate 100; coating a photoresist layer on the magnetic material layer, and exposing the photoresist layer using a mask; developing the exposed photoresist layer to obtain a photoresist pattern, the photoresist pattern exposing magnetic material layer corresponding to the active region 110 and covering the magnetic material layer corresponding to the dummy region 120; etching the magnetic material layer using the photoresist pattern as a mask, and then removing the photoresist pattern. For example, the method by which the magnetic material layer is formed on the base substrate 100 can comprise plating or evaporation, etc., and the embodiment of the disclosure does not limit the method by which the magnetic material layer is formed.

Hereinafter, the technical solution of at least one embodiment of the disclosure will be described by illustrating the arrangement of the magnetic layer 200 illustrated in FIG. 2A as an example.

Figure 4:
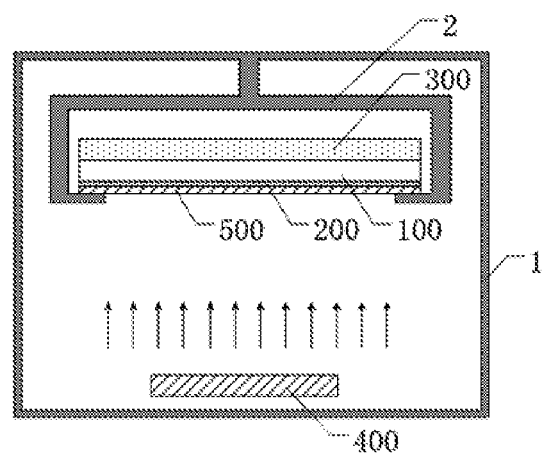
FIG. 4 is a schematic structural view illustrating that a base substrate on which a magnetic layer is formed is mounted in an evaporation device provided by an embodiment of the disclosure.

For example, the method of manufacturing a display substrate provided by at least one embodiment of the disclosure further comprises: forming an element layer on the first main surface 101 of the base substrate 100, and FIG. 4 is a schematic structural view illustrating that a base substrate formed with a magnetic layer thereon is mounted in an evaporation device provided by an embodiment of the disclosure. For example, as illustrated in FIG. 4, the evaporation device can comprise an evaporation source 400 and a magnetic adsorption layer 300. For example, the evaporation device can be a vacuum evaporation device, and can comprise a vacuum chamber 1 and a support part 2 etc. The support part 2 can support the magnetic adsorption layer 300.

For example, in at least one embodiment of the disclosure, the process of forming the element layer on the first main surface 101 of the base substrate 100 can comprise: as illustrated in FIG. 4, placing the base substrate 100 on which the magnetic layer 200 is formed in the evaporation device, wherein the base substrate 100 having the magnetic layer 200 is disposed between the magnetic adsorption layer 300 and the evaporation source 400, and the magnetic adsorption layer 300 is located on a side of the second main surface 102 of the base substrate 100; and performing an evaporation process on the first main surface 101 of the base substrate 100 to deposit the element layer 600.

The evaporation source 400 can comprise an evaporation material. During the evaporation process, the evaporation source 400 heats the evaporation material and changes it to a gas state, and the gaseous evaporation material deposits on the base substrate 100 and forms a structural layer of the corresponding material.

In the above evaporation process, the magnetic layer 300 can generate a magnetic adsorption force with the magnetic adsorption layer 300 in the evaporation device, which can alleviate or eliminate the drooping of the base substrate 100; and in the current evaporation process, because the base substrate to be evaporated will touch the base substrate due to the operations, such as the alignment, etc., the base substrate is easily broken. In the embodiment of the disclosure, the magnetic layer 200 can protect the surface of the base substrate 100, which reduces the break of the base substrate and improves the yield of the display substrate and reduces the cost. For example, the magnetic adsorption layer 300 can be a rigid structure. For example, the magnetic adsorption layer 300 can comprise a permanent magnet or an electromagnet etc.

For example, the method of manufacturing the display substrate provided by at least one embodiment of the disclosure further comprises: mounting a mask on a side of the first main surface 101 of the base substrate 100 before evaporation. As illustrated in FIG. 4, a mask 500 can be disposed between the base substrate 100 and the evaporation source 400. The mask 500 can be a metal mask (for example, a fine metal mask), and the magnetic adsorption force generated between the metal mask 500 and the magnetic attraction layer 300 can improve the adhesion between the metal mask 500 and the base substrate 100, to ensure the yield of the evaporation process.

Figure 5A:
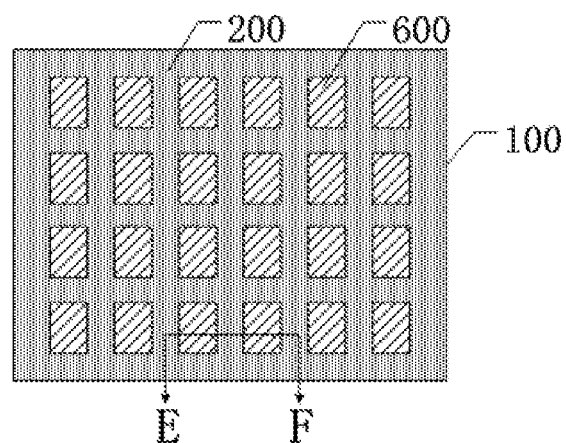
FIG. 5A is a schematic structural view of a display substrate motherboard provided by an embodiment of the disclosure.
Figure 5B:
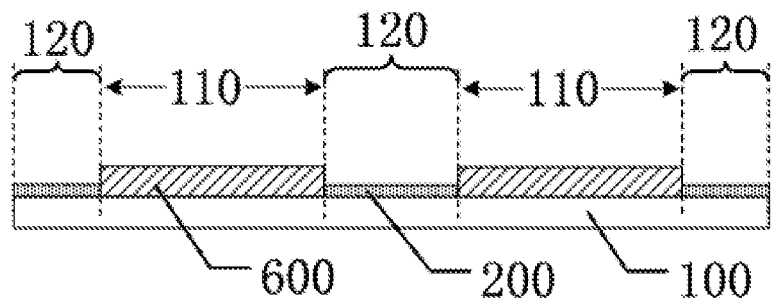
FIG. 5B is a cross-sectional view of the display substrate motherboard illustrated in FIG. 5A along E-F.

A display substrate motherboard is obtained after the element layer 600 is formed on the base substrate 100. FIG. 5A is a schematic structural view of the display substrate motherboard provided by an embodiment of the disclosure, and FIG. 5B is a cross-sectional view of the display substrate motherboard illustrated in FIG. 5A along the E-F. For example, FIGS. 5A and 5B are schematic views illustrating the structure of the display substrate motherboard after the completion of the evaporation process as illustrated in FIG. 4.

In at least one embodiment of the disclosure, the type of display substrate motherboard is not limited. For example, the display substrate motherboard can be an array substrate motherboard for a liquid crystal display. For example, the display substrate motherboard can be the display substrate motherboard of an organic light emitting diode (OLED).

For example, in at least one embodiment of the disclosure, as illustrated in FIGS. 5A and 5B, the display substrate motherboard can be the display substrate motherboard of the organic light emitting diode (OLED), and the element layer 600 comprises at least one of an anode, a cathode and an organic layer between the anode and the cathode of a light emitting device. For example, the organic layer comprises an organic light-emitting layer, and can further comprise any one or more of a hole injection layer, a hole transport layer, an electron injection layer, and an electron transport layer.

For example, in the method of manufacturing the display substrate provided by at least one embodiment of the disclosure, as illustrated in FIGS. 5A and 5B, the element layer 600 is formed at least on the base substrate 100 in the active region 110. The element layer 600 can be formed only in the active region 110 or can be simultaneously formed on the dummy region 120. The specific position of the element layer 600 is not limited by the disclosure.

For example, the method of manufacturing the display substrate provided by at least one embodiment of the disclosure further comprises: removing the magnetic layer 200 disposed on the base substrate 100. Because the magnetic layer 200 can be formed on the base substrate 100 at different positions, the methods of removing the corresponding magnetic layers 200 are different, which will be respectively described below.

Figure 6A:
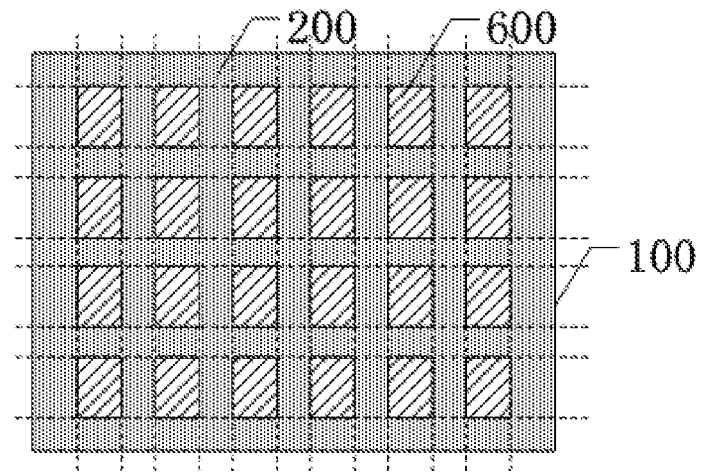
FIG. 6A is a schematic structural view of a process of cutting a display substrate motherboard provided by an embodiment of the disclosure.
Figure 6B:
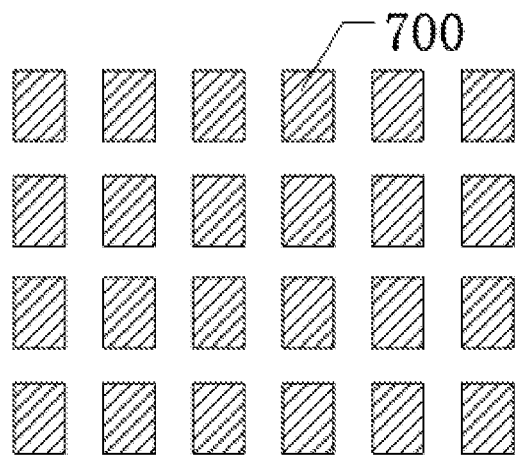
FIG. 6B is a view illustrating a distribution of the display substrate sub-board obtained by cutting the display substrate motherboard of FIG. 6A.

For example, the method of manufacturing the display substrate provided by at least one embodiment of the disclosure further comprises cutting the dummy region 120 of the base substrate 100 in a direction perpendicular to a surface of the base substrate 100. In other words, the dummy region is cut off. FIG. 6A is a schematic structural view illustrating a process of cutting a display substrate motherboard provided by an embodiment of the disclosure, and FIG. 6B is a view illustrating a distribution of the display substrate sub-board obtained by cutting the display substrate motherboard illustrated in FIG. 6A. For example, as illustrated in FIGS. 6A and 6B, the display substrate motherboard is cut along the broken line, to remove the portion corresponding to the dummy region 120 of the base substrate 100 of the display substrate motherboard, and the remaining portion of the substrate motherboard (the portion corresponding to the active region 110 of the base substrate 100 of the display substrate motherboard) is the display substrate sub-board 700. For example, the method of cutting the display substrate can comprise the cutter wheel cutting or the laser cutting etc.

In at least one embodiment of the disclosure, the magnetic layer 200 can be formed on the first main surface 101 of the base substrate 100 (e.g., the embodiment illustrated in FIGS. 2A-2C); and the magnetic layer 200 can also be formed on the first main surface 101 of the base substrate 100 within the dummy region 120 (e.g., the embodiment illustrated in FIG. 3A). For the above case, the magnetic layer 200 is only located on the surface within the dummy region 120 of the base substrate 100. During the process of cutting the display substrate motherboard to obtain the display substrate sub-board, the magnetic layer 200 will be cut together with the dummy region 120 of the base substrate, so that the magnetic substrate 200 is not present on the base substrate 700, which can prevent the magnetic layer 200 from interfering with electronic elements in the display substrate.

In at least one embodiment of the disclosure, as illustrated in FIG. 3B, the magnetic layer 200 is formed on the second main surface 102 of the base substrate 100, and the magnetic layer 200 is at least partially formed on the active region 110 of the base substrate 100. The method of manufacturing the display substrate of at least one embodiment of the disclosure further comprises: processing the magnetic layer 200 on the second main surface 102 of the base substrate 100 with a corrosive liquid to remove the magnetic layer 200. For example, during the process of thinning the display substrate motherboard, the portion of the second main surface 102 of the display substrate motherboard is removed by the corrosive liquid, and thus the magnetic layer 200 on the second main surface 102 can be simultaneously removed. Then, the cutting process is performed on the display substrate to obtain a display substrate sub-board 700.

It should be noted that, in the above mentioned embodiment, the cutting process is not limited to cut the display substrate motherboard. Also, after the display substrate motherboard is processed into a display panel motherboard, the display panel motherboard is cut to obtain a plurality of display panel sub-boards.

At least one embodiment of the disclosure provides a display substrate motherboard comprising: a base substrate comprising a first main surface and a second main surface opposite to each other and divided into at least one active region and a dummy region located around the active region; a magnetic layer, disposed on at least one of the first main surface within the dummy region and the second main surface; and an element layer disposed on the first main surface. In the display substrate motherboard, the base substrate has a magnetic layer thereon, and the magnetic adsorption force can alleviate or eliminate the problem that the display substrate motherboard (a plurality of display substrate sub-boards can be obtained after cutting the display substrate mother board) droops.

For example, in the display substrate motherboard provided by at least one embodiment of the disclosure, the element layer is formed at least in the active region.

For example, in a display substrate motherboard provided by at least one embodiment of the disclosure, the magnetic layer is disposed on the second main surface within the dummy region.

The structure of the display substrate motherboard can refer to the structure illustrated in FIGS. 5A and 5B, and the description of the specific structure of the display substrate motherboard can also refer to the above mentioned embodiments (the embodiments related to the method of manufacturing the display substrate), which will not be described in the embodiments of the disclosure.

It should be noted that, in the embodiment of the disclosure, if the magnetic layer 200 is permitted to be disposed on the base substrate 100 of the display substrate sub-board 700, a separate process of cleaning the magnetic layer 200 is not required, and the magnetic layer 200 can be formed at any position of the main surface of the base substrate 100.

At least one embodiment of the disclosure provides a method of manufacturing a display substrate and a display substrate motherboard, and can have at least one of the following beneficial effects:

(1) At least one embodiment of the disclosure provides a method of manufacturing a display substrate, and a magnetic layer is formed on a base substrate of the display substrate. During the evaporation process, the drooping of the base substrate can be alleviated or eliminated by the magnetic adsorption force, so as to improve the evaporation yield of the display substrate.

(2) In the method of manufacturing the display substrate provided by at least one embodiment of the disclosure, the magnetic layer covers and protects the main surface of the base substrate, which reduces the risk of the break of the base substrate during the operation.

(3) In the method of manufacturing the display substrate provided by at least one embodiment of the disclosure, the magnetic layer is formed on the main surface of the dummy region of the base substrate, and during the cutting process, the magnetic layer is cut together with the dummy region of the base substrate, which simplifies the process of manufacturing the display substrate and reduces the cost.

(4) When the mask is a metal mask (for example, a fine metal mask), the magnetic adsorption force generated between the metal mask and the magnetic adsorption layer can improve the adhesion between the metal mask and the base substrate, which ensures the yield of the evaporation process.

The following statements should be noted:

(1) The accompanying drawings involve only the structure(s) in connection with the embodiment(s) of the disclosure, and other structure(s) can be referred to common design(s).

(2) For the purpose of clarity only, in accompanying drawings for illustrating the embodiment(s) of the disclosure, the thickness and size of a layer or a structure may be enlarged, that is to say, these drawings are not drawn in scale.

(3) In case of no conflict, features in one embodiment or in different embodiments can be combined.

The foregoing is merely exemplary embodiments of the invention, but is not used to limit the protection scope of the invention. The protection scope of the invention shall be defined by the attached claims.

The invention claimed is:

1. A method of manufacturing a display substrate, comprising:
   providing a base substrate having a first main surface and a second main surface opposite to each other and including at least one active region and a dummy region located around the active region;
   forming a magnetic layer on the first main surface within the dummy region; and
   forming an element layer on the first main surface.

2. The method according to claim 1, wherein forming the element layer on the first main surface comprises:
   placing the base substrate formed with the magnetic layer thereon into an evaporation device including an evaporation source and a magnetic absorption layer; and
   performing an evaporation process on the first main surface to form the element layer;
   wherein the base substrate is located between the magnetic adsorption layer and the evaporation source, and the magnetic adsorption layer is located on a side of the second main surface of the base substrate.

3. The method according to claim 1, wherein
   an orthographic projection of the magnetic layer on the first main surface is located within or coincides with the dummy region.

4. The method according to claim 1, further comprising:
mounting a mask on a side of the first main surface of the substrate before the evaporation process.

5. The method according to claim 1, wherein
the element layer comprises at least one selected from the group consisting of an anode, a cathode and an organic layer between the anode and the cathode of a light emitting device.

6. The method according to claim 1, wherein
the element layer is at least formed in the active region.

7. The method according to claim 1, wherein
the at least one active region comprises a plurality of active regions arranged at intervals, and the dummy region is disposed between adjacent active regions.

8. The method according to claim 1, further comprising:
cutting off the dummy region of the substrate.

9. The method according to claim 2, wherein
an orthographic projection of the magnetic layer on the first main surface is located within or coincides with the dummy region.

10. A display substrate motherboard, comprising:
a base substrate having a first main surface and a second main surface opposite to each other and including at least one active region and a dummy region located around the active region;
a magnetic layer on the first main surface within the dummy region; and
an element layer on the first main surface.

11. The display substrate motherboard according to claim 10, wherein
the element layer is at least formed in the active region.

* * * * *

UNITED STATES PATENT AND TRADEMARK OFFICE
CERTIFICATE OF CORRECTION

PATENT NO. : 11,277,930 B2
APPLICATION NO. : 16/090967
DATED : March 15, 2022
INVENTOR(S) : Zhongying Yang and Jianpeng Wu It is certified that error appears in the above-identified patent and that said Letters Patent is hereby corrected as shown below:

On the Title Page

Item (73) Assignee:
"BOE TECHNOLOGY GROUP CO., LTD., BEIJING (CN)
CHENGDU BOE OPTOELECTRONICS TECHNOLOGY CO., TLD., SICHUAN (CN)"
Is changed to:
-- BOE TECHNOLOGY GROUP CO., LTD., BEIJING (CN)
CHENGDU BOE OPTOELECTRONICS TECHNOLOGY CO., LTD., SICHUAN (CN) --

Signed and Sealed this
Eleventh Day of July, 2023

Katherine Kelly Vidal
*Director of the United States Patent and Trademark Office*